(12) United States Patent
Long

(10) Patent No.: US 8,076,761 B1
(45) Date of Patent: Dec. 13, 2011

(54) REDUCED INDUCTANCE IC LEADED PACKAGE

(75) Inventor: Jon M. Long, Livermore, CA (US)

(73) Assignee: Altera Corporation, San Jose, CA (US)

( * ) Notice: Subject to any disclaimer, the term of this patent is extended or adjusted under 35 U.S.C. 154(b) by 1332 days.

(21) Appl. No.: 10/757,695

(22) Filed: Jan. 13, 2004

(51) Int. Cl.
*H01L 23/495* (2006.01)

(52) U.S. Cl. ........................................ 257/666; 257/667

(58) Field of Classification Search .................. 257/667, 257/666
See application file for complete search history.

(56) References Cited

U.S. PATENT DOCUMENTS

| 5,559,306 | A | 9/1996 | Mahulikar |
| 5,955,777 | A | 9/1999 | Corisis et al. |
| 6,215,175 | B1 | 4/2001 | Kinsman |
| 6,310,388 | B1 * | 10/2001 | Bissey ........................... 257/666 |
| 6,326,687 | B1 * | 12/2001 | Corisis .......................... 257/713 |
| 6,482,674 | B1 | 11/2002 | Kinsman |
| 6,523,608 | B1 * | 2/2003 | Solbrekken et al. .......... 165/185 |

* cited by examiner

*Primary Examiner* — Thien F Tran
(74) *Attorney, Agent, or Firm* — Ward & Zinna, LLC

(57) ABSTRACT

The present invention is directed a novel method and apparatus for reducing crosstalk in a lead frame based electrical device package. One cause of the crosstalk in the lead frame package is the mutual inductance between adjacent lead fingers. A conductive sheet or mesh is introduced into the lead frame package such that one edge of the conductive sheet is below the die attach pad and electrically connected to the die and another edge is below the lead fingers and electrically connected to the ground lead of the package. Such arrangement significantly reduces the inductive coupling between adjacent lead fingers by coupling the lead fingers with the conductive sheet. The conductive sheet includes an array of through holes allowing the encapsulant material from the two sides of the sheet to flow smoothly together into one body.

13 Claims, 7 Drawing Sheets

REDUCED INDUCTANCE IC LEADED PACKAGE

FIELD OF THE INVENTION

The present invention relates generally to the field of electrical device packaging, and in particular to a lead package that significantly reduces self and mutual inductance of the package leads by introducing a voltage reference plane into the package.

BACKGROUND OF THE INVENTION

Semiconductor technology development has been following two significant trends from its very beginning. One trend is that the operating frequency of an integrated circuit (IC) device gets higher and higher. For example, the main operating frequency of the Intel386™ central processing unit (CPU) developed in the mid-1980's was only about 33 MHz. In contrast, the main operating frequency of today's Intel Pentium4™ CPU reaches 3.2 GHz, which is approximately 100 times faster than Intel386™ CPU. Higher frequency makes it possible for a device to process more data within a limited time period.

The other trend is that the number of transistors per IC grows exponentially according to the well known Moore's Law. For instance, the Intel386™ CPU hosts only 275K transistors while the Intel Pentium 4 CPU hosts 42 million transistors. The placement of more and more transistors on a silicon chip of limited dimension continuously reduces the minimum feature size, i.e., the dimension of the smallest feature actually constructed on the chip in the manufacturing process. As a result, the minimum feature size of a device drops sharply from about 1.5 micron in the Intel386™ CPU to just 0.13 micron in the Intel Pentium 4 CPU. The higher volume of electrical components on a single silicon chip tremendously enhances an IC device's data-processing capability, which in turn requires better input/output (JO) and package protection.

The downside of the aforementioned technology revolution is that certain previously ignored issues that are related to either a device or an electrical package protecting the device are becoming so critical that they may substantially hinder the progress of semiconductor technology if not dealt with appropriately. Among them, the issue of crosstalk-related signal integrity is one that deserves special attention. Crosstalk refers to electrical noise caused by mutual inductance between two conductive lines, e.g., two conductive traces in a device or two package leads, due to their proximity. If such noise is great enough, it may corrupt the electrical signal traveling through a device and disturb the normal function of the device.

FIG. 1A schematically depicts the mutual inductance between two adjacent circuits 120 and 126. Circuit 120 includes a power source 122 that generates a current moving in a counter-clockwise direction as indicated by the arrows. Some electric energy generated by power source 122 is converted into magnetic energy and stored in the magnetic field surrounding the circuit path as indicated by the magnetic flux lines 124. The amount of magnetic energy stored per unit volume is proportional to the current in circuit 120. A portion of the magnetic flux passes through loop 125 formed by circuit 126, which has a resistor 128, but no power source. Faraday's Law states that a time-varying current in circuit 120 results in a time-varying magnetic field surrounding circuit 120, which subsequently induces a voltage and current in circuit 126. The direction of the induced current in circuit 126 is opposite to that in circuit 120 or clockwise. The induced voltage or crosstalk is proportional to the rate of change of current in circuit 120.

FIG. 1B illustrates how crosstalk may affect signal integrity in an integrated circuit. Curve 140 represents an ideal step response in which the voltage of a digital circuit jumps from $V_{min}$ (or zero) to $V_{max}$ instantaneously. Such an ideal scenario rarely exists in real life because it always takes some time for the voltage level to rise or drop from one extreme to another extreme. Curve 142 demonstrates a more realistic step response in which the time it takes for the voltage to rise to 70% of $V_{max}$, or trigger voltage $V_{trigger}$, is referred to as the rise time $T_r$, of the circuit. The rise time is an important parameter for measuring the speed of a circuit. Specifically, the shorter the rise time the faster the circuit. However, the mutual inductance between this and adjacent circuits may induce a voltage $V_{inductance}$ in the circuit (curve 144). When voltage $V_{inductance}$ that has a different polarity is superimposed on the step response (curve 142), the voltage may not reach the trigger voltage $V_{trigger}$ during the rise time indicated by curve 146, but only a lower voltage level $V_{delta}$. Such a lower voltage level may cause the circuit to malfunction and produce undesirable results.

The magnitude of crosstalk caused by mutual inductance as shown in FIG. 1A is a function of the distance between the two neighboring circuits 120 and 126, their relative orientations, the overlapping area of the loops formed by the two circuits and the operating frequency in the circuits. Higher frequency usually results in more significant crosstalk. In an IC device, smaller minimum feature size reduces the distance between two adjacent circuits and thus increases the crosstalk in the device. As a result, both of the two development trends discussed above exacerbate crosstalk-related problems.

Meanwhile, the signal voltage of an IC device is roughly proportional to the device's minimum feature size. For example, the signal voltage of a device having a minimum feature size of 0.3 micron is about 3V while the signal voltage of a device having a minimum feature size of 0.13 micron is only about 1.3V. The trigger voltage correspondingly reduces from 2.1V to 0.9V when the minimum feature size reduces from 0.3 micron to 0.13 micron. While lower signal voltage is welcome because it reduces a device's power consumption, it unfortunately reduces the device's tolerance threshold for crosstalk at the same time. Therefore, the crosstalk that previously could be safely ignored may pose a significant challenge to a device's normal operation now and therefore should be treated appropriately.

In view of higher crosstalk due to higher operating frequency and smaller minimum feature size and lower tolerance of crosstalk by today's IC devices, it is highly desirable to develop a new strategy that can effectively reduce the crosstalk-related signal integrity issue without significant changes to the conventional semiconductor packages.

SUMMARY

The present invention is directed to a new quad flat package (QFP) that in one embodiment comprises a die, a die attach pad, lead fingers, an encapsulant and a conductive sheet or mesh. The conductive sheet is embedded in the encapsulant and has at least an inner area and an outer area such that the inner area is electrically connected to the die attach pad and the die, and the outer area is electrically connected to the ground lead of the lead frame.

The conductive sheet is arranged such that the path of a return current from the die to a lead finger at a high operating frequency, e.g., 300 MHz and above, concentrates at one portion on the sheet that is adjacent and parallel to the lead finger. As a result, in the present invention, there is more inductive coupling between a lead finger and the sheet and less inductive coupling between two immediately adjacent lead fingers. This substantially reduces the crosstalk caused by mutual inductance.

In addition, the conductive sheet is provided with a sufficient opening or openings to allow the encapsulant to flow through the sheet and form into one body. Such arrangement can effectively prevent detachment between the encapsulant and the conductive sheet during the packaging process.

BRIEF DESCRIPTION OF THE DRAWINGS

The aforementioned features and advantages of the invention as well as additional features and advantages thereof will be more clearly understood hereinafter as a result of a detailed description of preferred embodiments of the invention when taken in conjunction with the drawings.

DESCRIPTION OF EMBODIMENTS

The present invention relates to a novel packaging strategy that can substantially reduce crosstalk caused by mutual inductance in an electrical device package, e.g., a quad flat package, and improve signal integrity of the electrical device embedded in the package.

Since crosstalk in an electrical device package largely depends upon the package's physical structure, e.g., distance of adjacent conductive paths, it is important to understand those structural features of the package that contribute to the creation of crosstalk.

Figure 1:
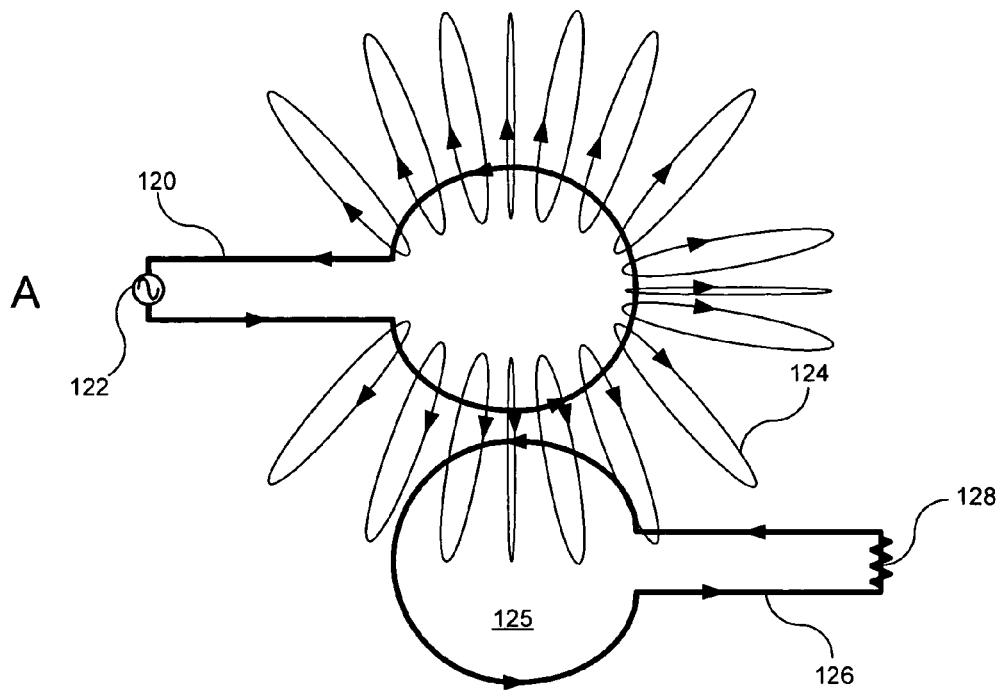
FIG. 1A schematically depicts the mutual inductance between the two circuits.
FIG. 1B illustrates how crosstalk affects signal integrity in an integrated circuit.
Figure 1:
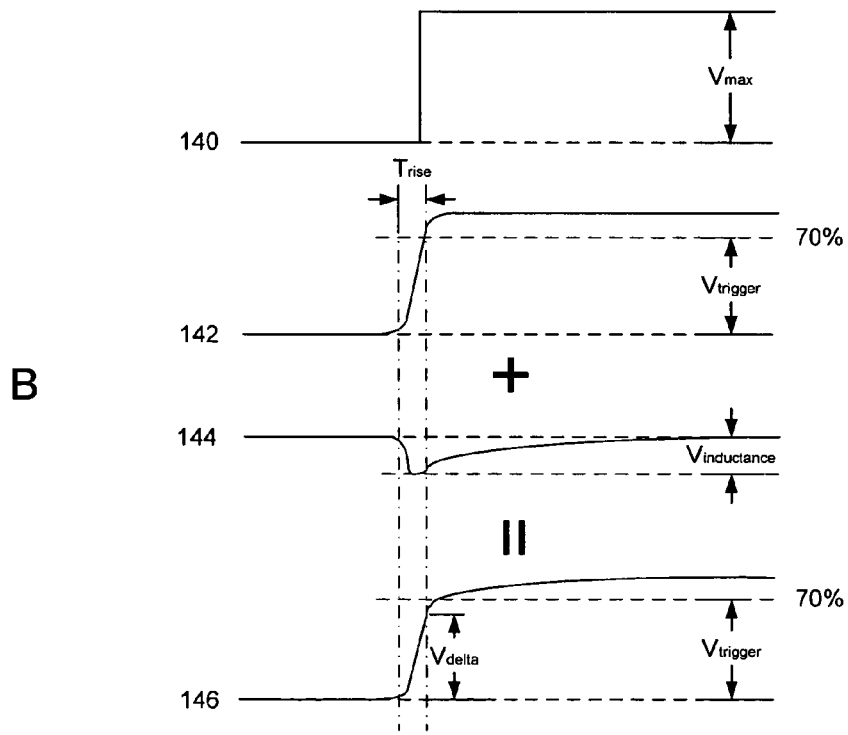
Figure 2:
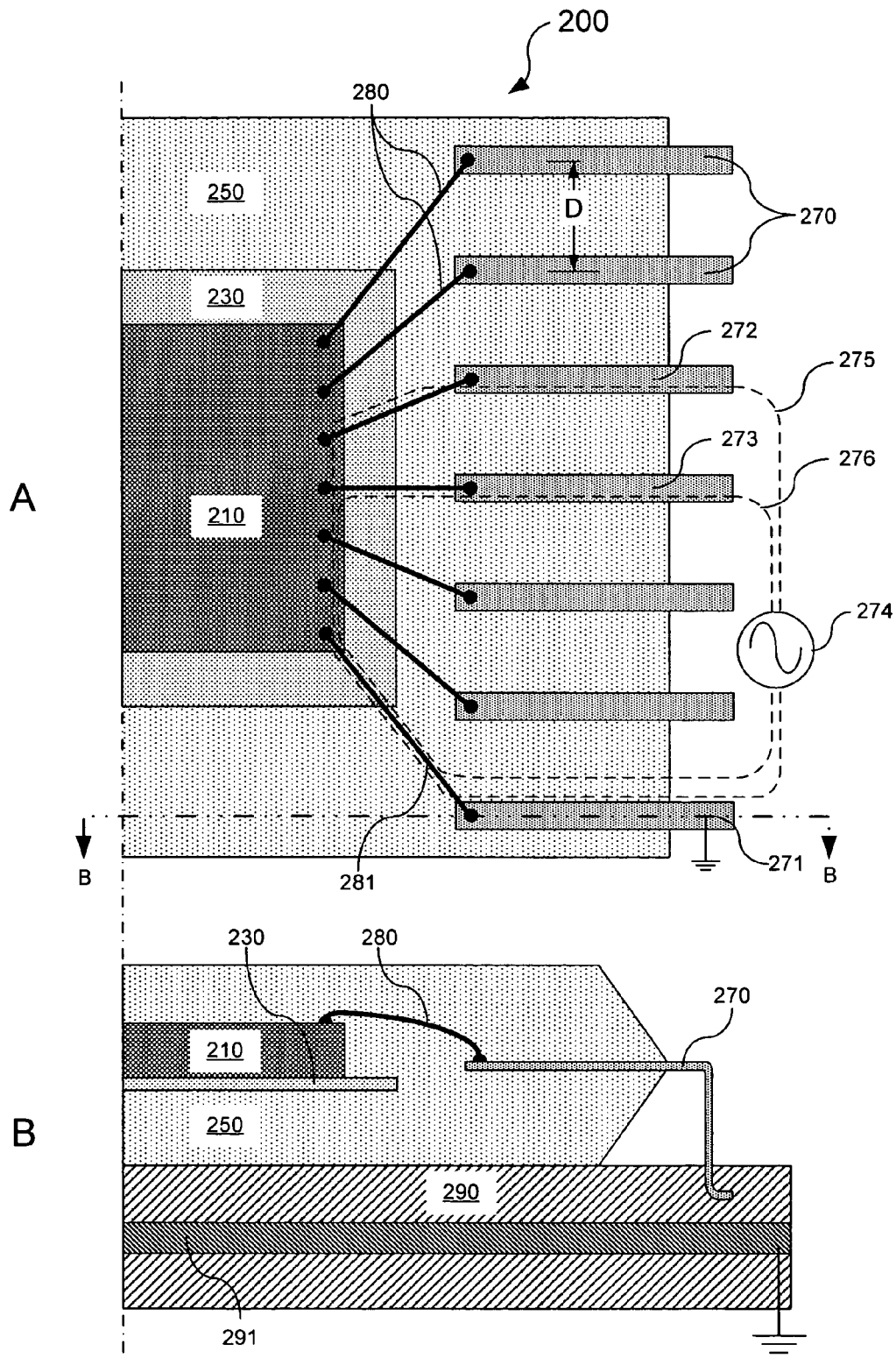
FIGS. 2A and 2B schematically depict top and side sectional views, respectively, of a prior art quad flat package.

FIG. 2A is a top view of half of a prior art quad flat package 200. Package 200 comprises a semiconductor die 210, a die attach pad 230 below die 210 and encapsulant 250 surrounding die 210 and die attach pad 230. One end of each of a plurality of bondwires 280 is electrically connected to a bond pad on die 210 and the other end to a lead finger 270 deployed on an edge of package 200. Typically, there are lead fingers (not shown) on all the other edges of the package that are connected to bond pads on the die by other bondwires (not shown). Electrical signals travel through lead fingers 270 and bondwires 280 between die 210 and other electrical devices (not shown). FIG. 2B is a side sectional view of package 200 taken along lines B-B of FIG. 2A. Also shown in FIG. 2B is a cross-sectional view of a printed circuit board (PCB) 290 to which package 200 is attached. A conductive plane 291 made of a material such as copper is embedded in PCB 290.

Further details of the prior art package's internal structure are also shown in FIG. 2A. Specifically, lead fingers 270 deployed on each edge of package 200 are substantially parallel to each other. The distance D between two immediately adjacent lead fingers has been greatly exaggerated for illustrative purpose. In reality, this distance is typically 80-100 microns. At least one lead finger 271 is electrically connected to the ground. This lead finger is also known as the ground lead.

If we observe any two immediately adjacent lead fingers 272 and 273, we will note that each lead finger is a part of a separate electrical current loop 275 or 276. Each current loop includes electrical power source 274, ground lead 271, bondwire 281 that connects die 210 to ground lead 271 and one of the two lead fingers 272 or 273 that carry electrical signals. Since the two loops overlap each other, the area subtended by loop 275 is part of the area subtended by loop 276. As a result, a significant amount of magnetic flux associated with a current in loop 275 passes through loop 276 and vice versa. According to Faraday's Law, if there is a time-variant current in one loop, a corresponding voltage or crosstalk will be induced in the other loop. FIG. 2A also suggests that merely increasing the distance between two adjacent lead fingers cannot defeat crosstalk effectively since there is still a significant amount of overlapping area between the two loops.

Figure 3:
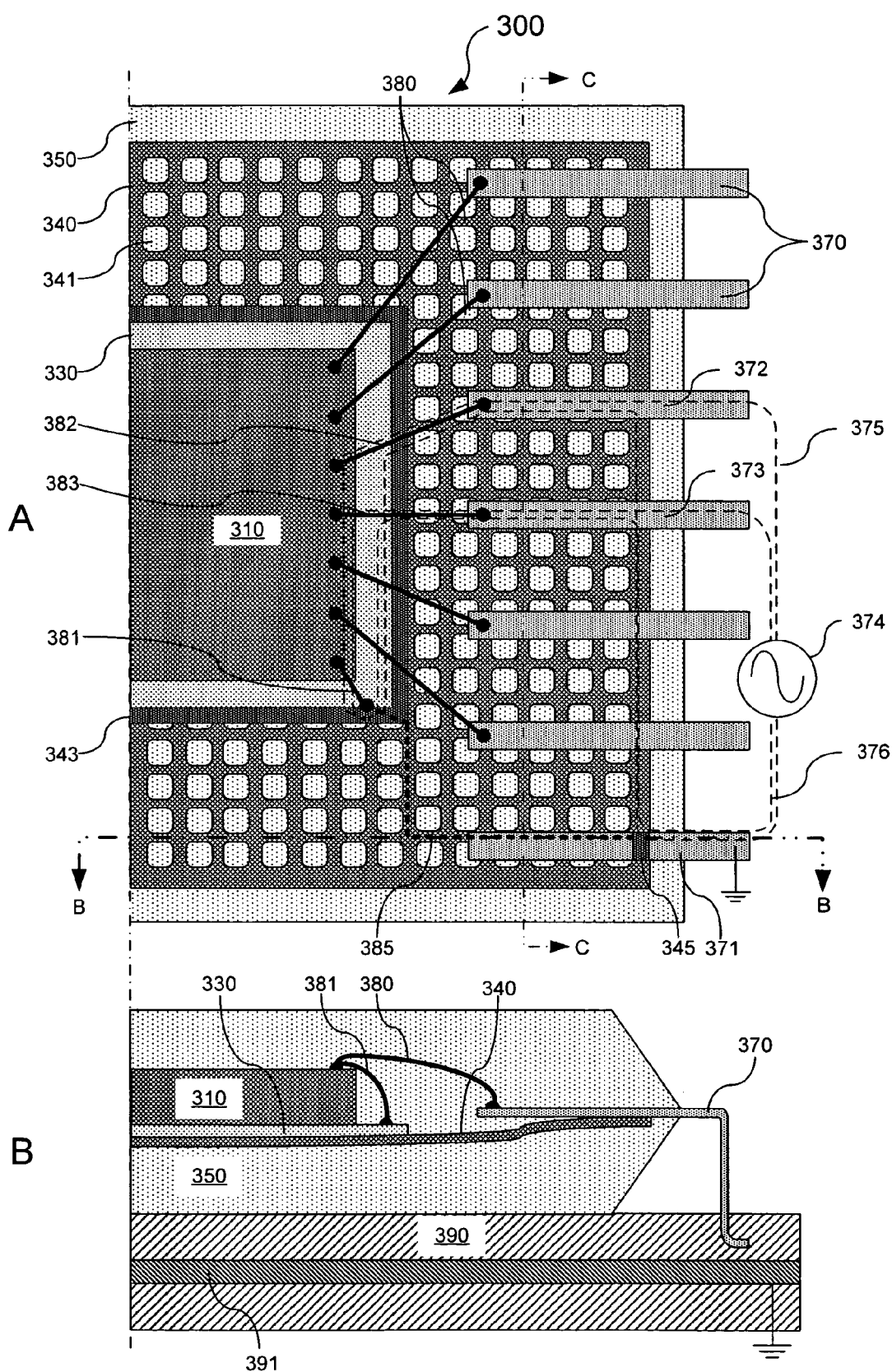
FIGS. 3A and 3B schematically depict top and side sectional views, respectfully, of a quad flat package that includes a conductive sheet according to the present invention.
FIGS. 3C and 3D illustrate crosstalk between leads and the conductive sheet in the quad flat package of the present invention.
Figure 3:
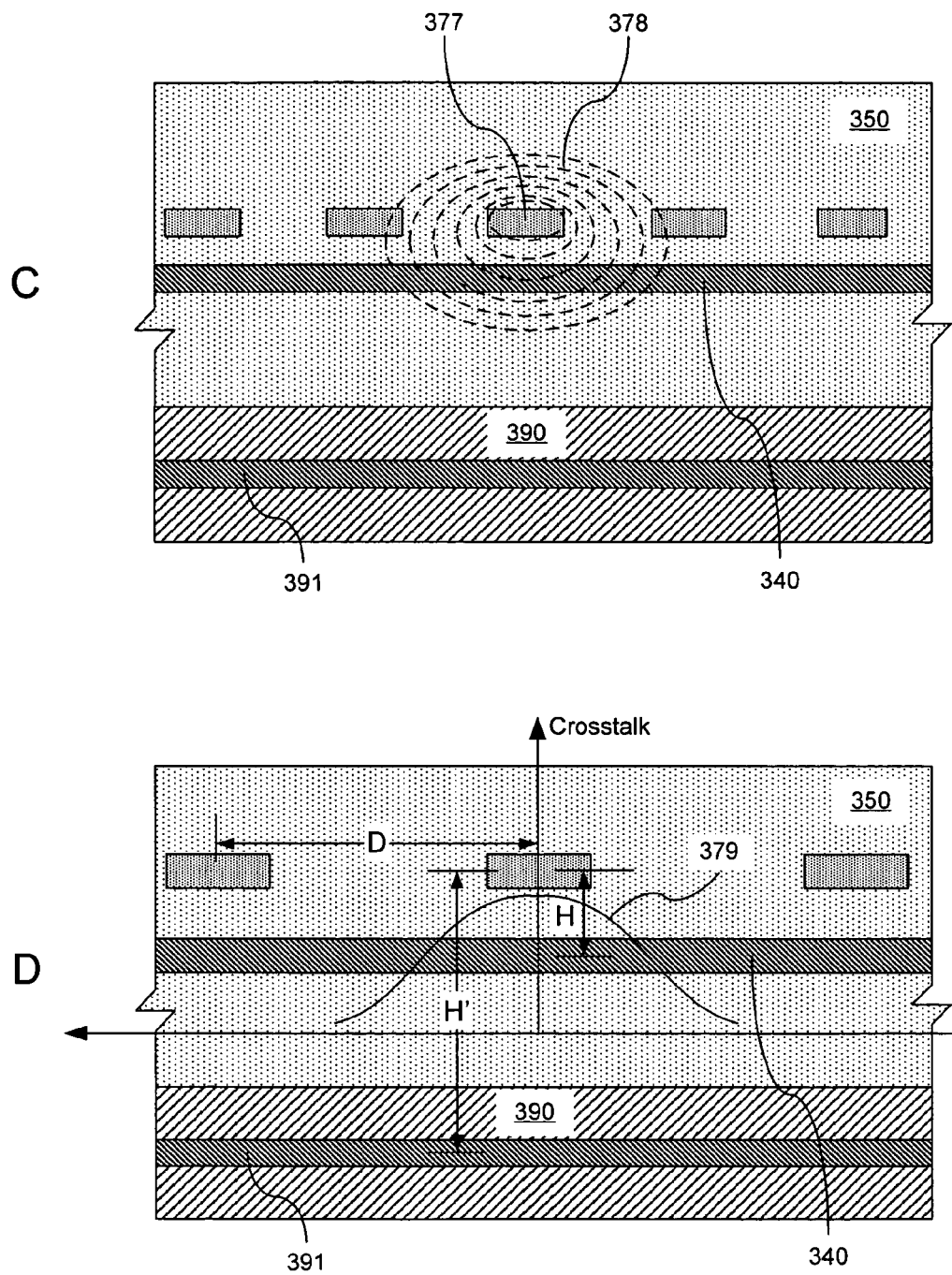

FIG. 3A is a top view of half of a quad flat package 300 in accordance with one embodiment of the present invention. Similar to the prior art package 200, package 300 comprises a semiconductor die 310, a die attach pad 330 below die 210 and encapsulant 350 surrounding die 310 and die attach pad 330. There are bondwires 380 inside encapsulant 350 electrically connecting bond pads on die 310 to a plurality of lead fingers 370 deployed on an edge of package 300. Of these lead fingers, at least finger 371 is a ground lead. Again, lead fingers (not shown) on the other edges of the package are also connected to bond pads on die 310 by bondwires (not shown). FIG. 3B is a side sectional view taken along lines B-B of FIG. 3A. Also shown in FIG. 3B is a cross-sectional view of a printed circuit board (PCB) 390 to which package 300 is attached. A conductive plane 391 made of a material such as copper is embedded in PCB 390.

There are two principal structural differences between package 300 and package 200. One difference is that a conductive sheet 340 made of material such as copper is positioned inside encapsulant 350 such that one side of the conductive sheet 340 is electrically connected to die attach pad 330 and another side of the conductive sheet 340 is electrically connected to the ground lead 371, as represented by the dark areas 343 and 345, respectively, in FIG. 3A. It should be noted that there is insulating material between the conductive sheet 340 and those lead fingers other than the ground lead. As will be apparent, the conductive sheet 340 includes an array of through holes 341, the function of which will be discussed in more detail below. The other difference is that there is a bondwire 381 electrically connecting a ground bond pad on die 310 to die attach pad 330. Therefore, bondwire 381, die attach pad 330 and conductive sheet 340 become part of the return current path in package 300. As a result, there is no need for a bondwire like bondwire 281 in FIG. 2B that electrically connects die 210 to the ground lead 271.

Figure 4:
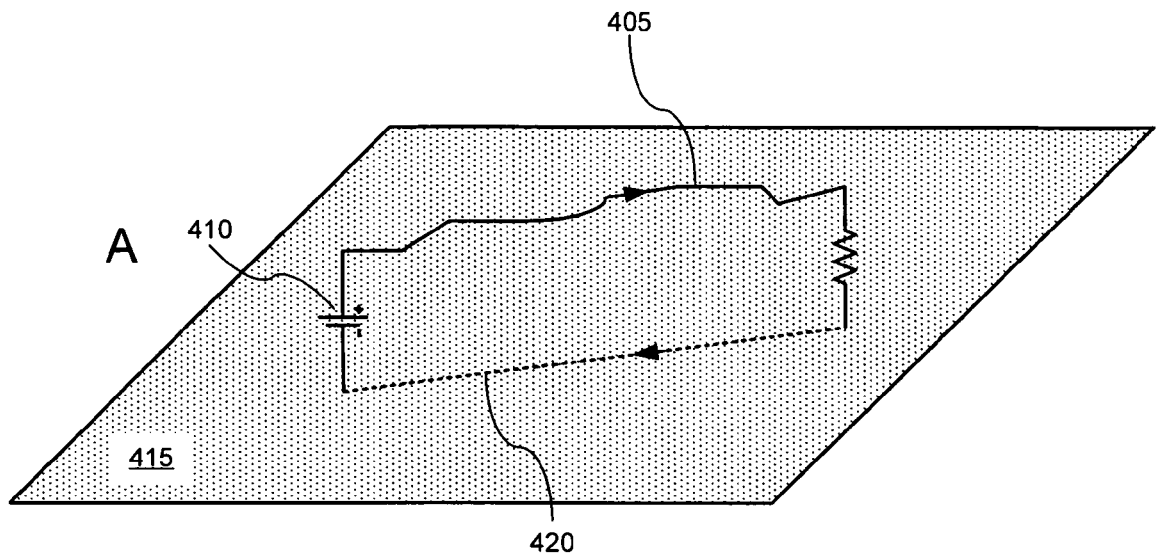
FIGS. 4A and 4B depict return signal paths at low and high operating frequencies, respectively.
Figure 4:
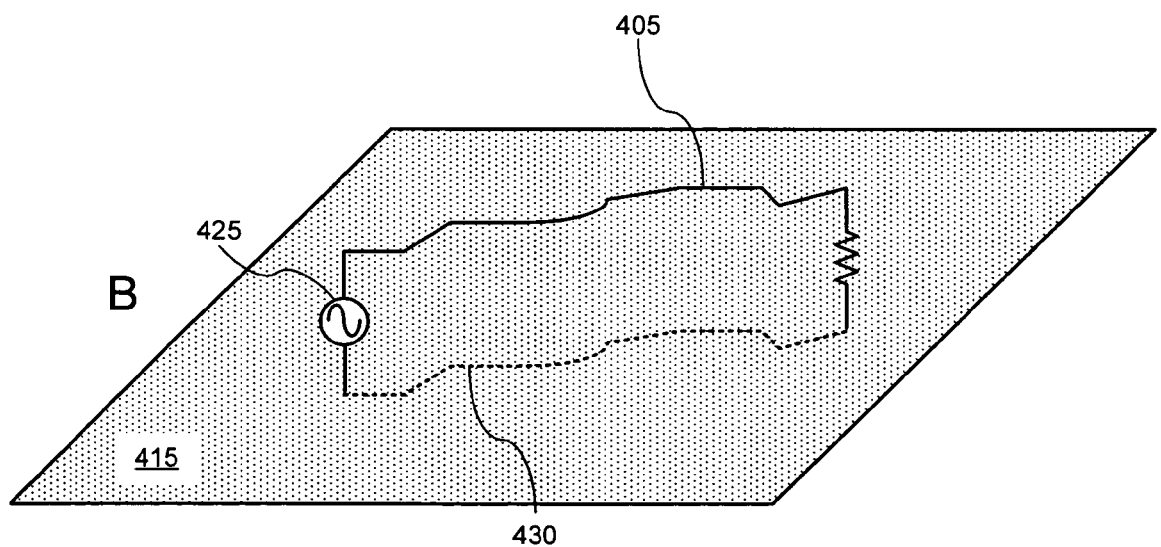

In this case, if we consider any two immediately adjacent lead fingers 372 and 373 and associated bondwires 382, 383, respectively, we will note that new electrical current loops are established in package 300 that are significantly different from those loops formed in package 200. Specifically, the combination of bondwire 381, die attach pad 330 and the conductive sheet 340 replace the bondwire 281 in establishing the electrical current loops 375 and 376 in package 300. In particular, because the electrical current always travels in a path of least impedance, the return current path in the conductive sheet 340 for each loop is directly underneath the current path in the corresponding lead finger and bondwire as well as along the edge of die attach pad 330 from the point of attachment of bondwire 381 to underneath bondwire 382 or 383, and along the edge of the conductive sheet 340 from underneath lead finger 372 or 373 to the ground lead 371. The reason that these loops 375 and 376 are paths of least resistance is discussed below in conjunction with FIG. 4. When compared with their counterparts in FIG. 2B, the areas subtended by current loops 375 and 376 in FIG. 3A are significantly smaller. As a result, the crosstalk caused by mutual inductance between adjacent lead fingers is also reduced substantially.

The basic principle of the present invention is to create a voltage reference plane close enough to the lead fingers that carry electrical signals to reduce the mutual inductance between adjacent lead fingers. Therefore, from the teaching of the present disclosure, it will be evident to those of ordinary skill in the art that the structure discussed above in connection with FIGS. 3A and 3B can reduce the mutual inductance and therefore the crosstalk if the conductive sheet is electrically connected to the device's power supply, instead of the ground lead.

FIGS. 3C and 3D provide a cross-sectional view of package 300 along lines C-C of FIG. 3A. FIG. 3C shows that the vertical distance H (approx. 75 microns) between the conductive sheet and the lead fingers is not only significantly smaller than the vertical distance H' (approx. 1.5 mm) between the conductive plane 391 and the lead fingers, but also smaller than the lateral distance D (approx. 80-100 microns) between two immediately adjacent lead fingers. In general, cross talk can be shown to be directly proportional to $$\frac{1}{1+\left(\frac{D}{H}\right)^2}.$$

As a result, the magnitude of crosstalk is significantly reduced as long as distance D is greater than distance H. In other words, because of the proximity between the conductive sheet and lead fingers, the inductive coupling that would be observed between two immediately adjacent lead fingers existing in the prior art package 200 is greatly suppressed and replaced by a strong inductive coupling between the conductive sheet and lead fingers. Therefore, the crosstalk between adjacent lead fingers drops off dramatically and the signal integrity of the package 300 improves significantly.

As noted above, the return current of an electrical current loop like 375 does not reach the ground following a direct path such as dotted line 385 but takes a "detour" to travel in a direction opposite to the incoming current as suggested by loop 375. This is because the electrical current always travels in a path of least impedance. The impedance of a conductor depends on the resistance and self inductance of the conductor, of which resistance is frequency-independent while self inductance is frequency-dependent.

FIGS. 4A and 4B depict an electrical circuit 405 connected at either end to a conductive plate 415. In FIG. 4A, circuit 405 includes a power source such as a battery 410. Thus, the resulting current in the circuit is a direct current (DC) having zero frequency. In other words, there is no self inductance in this case and the impedance of the conductive plate 415 is the same as its resistance. Assuming that the conductive plate 415 is made of a homogeneous material, e.g., copper, the return current path of circuit 405 is a straight line 420 in the conductive plate 410. In contrast, as shown in FIG. 4B, if a power source 425 in the circuit 405 generates a high-frequency alternating current (AC), e.g., 100 MHz, the self inductance of a return current path is more significant than its resistance. In other words, the impedance of the conductive plate 415 is virtually the same as its inductance. Among all possible return current paths, path 430 which is directly below circuit 405 is the one of least self inductance because the loop formed by this path and the path outside conductive plate 415 subtends the smallest area. Since the operating frequency of an electrical device in the present invention is usually above 100 MHz, the return current path should be the path of least self inductance. As a result, the return current paths of loops 375 and 376 in FIG. 3A are directly under the incoming current paths.

While a solid conductive sheet has the advantage that there is no physical restriction to the return current path, a sheet like conductive sheet 340 in FIG. 3A having a plurality of through holes 314 in FIG. 3A is preferred. If a solid sheet is used for establishing the return current path, some moisture may become attached to the two surfaces of the solid sheet during the packaging process. If the moisture is not completely removed from the solid conductive sheet before the sheet is encapsulated in the encapsulant, it may be trapped inside the two halves of encapsulant that are attached to the two surfaces of the conductive sheet. When the package is later mounted onto a printed circuit board, the temperature of the package may easily rise above 100° C., because the solder material that connects the package and the printed circuit board melts at about 220° C. In such a high temperature environment, the moisture on the surface of the solid conductive sheet turns into steam. If there is sufficient amount of moisture and the steam pressure is sufficiently high, the steam pressure may push the two halves of encapsulant away from the solid conductive sheet, damaging the electrical device embedded in the package. In contrast, a conductive sheet having a plurality of through holes such as through holes 341 of FIG. 3A has far less surface area for moisture accumulation. More important, the two halves of encapsulant flow into the through holes and combine together into one body. As a result, the possibility that the encapsulant breaks into two halves is significantly reduced. In order for the encapsulant to achieve a reasonable flowing rate, it is preferred that the area of the through holes 341 or openings in the conductive sheet should be greater than or equal to 50% of the solid area of the sheet.

Figure 5:
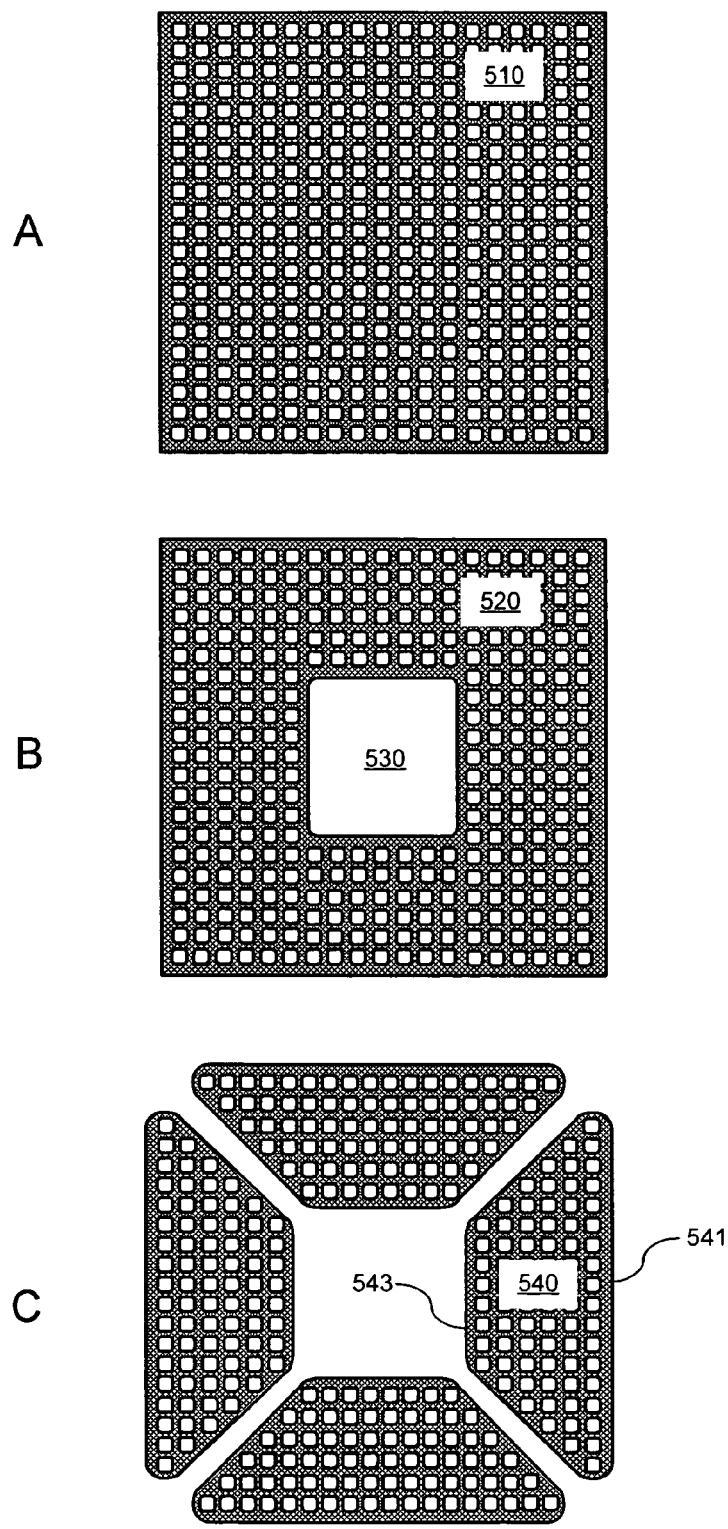
FIGS. 5A-5C depict three embodiments of the conductive sheet of the present invention.

FIGS. 5A-5C depict three embodiments of the present invention. In sheet 510 of FIG. 5A there is a rectangular array of through holes. The dimension of the through holes should be large enough for the encapsulant material to flow smoothly through the holes. In one embodiment, the diameter of solid particles in the encapsulant is about 3 mils, and the opening of each through hole is about 8 mils to allow at least two particles to move through the holes simultaneously. In other words, the diameter of a through hole in a conductive sheet should be at least 4 mils.

In sheet 520 of FIG. 5B there is also a rectangular array of through holes, but the center 530 of the conductive sheet 520 is removed. In particular, as shown in FIG. 3B, the portion of the conductive sheet 340 below the die attach pad 330 is not part of any current loop. Therefore, this portion of the conductive sheet as shown in FIG. 5B can be removed to further improve the spreading of encapsulant material and strengthen the connection between the two halves of the encapsulant.

In sheet 540 of FIG. 5C the conductive sheet is divided into four separate pieces 540, each piece responsible for establishing the return current path in one of the four directions. Each piece 540 has two opposite edges, one outer edge 541 electrically connected to the ground lead of a lead frame (not shown) and one inner edge 543 electrically connected to a die attach pad (not shown). Since each of the four conductive pieces 540 can be selectively introduced into an electrical package, the connection between the two halves of encapsulant may be further improved.

From the above description, it will be apparent to a person having ordinary skill in the art that a mesh made of conductive material, such as copper, may serve the same purpose achieved by the conductive sheet of the present invention. The advantage of a copper mesh is that it usually has a greater opening area than a copper sheet of the same size and its manufacturing cost is often significantly lower than that of the sheet.

Figure 6:
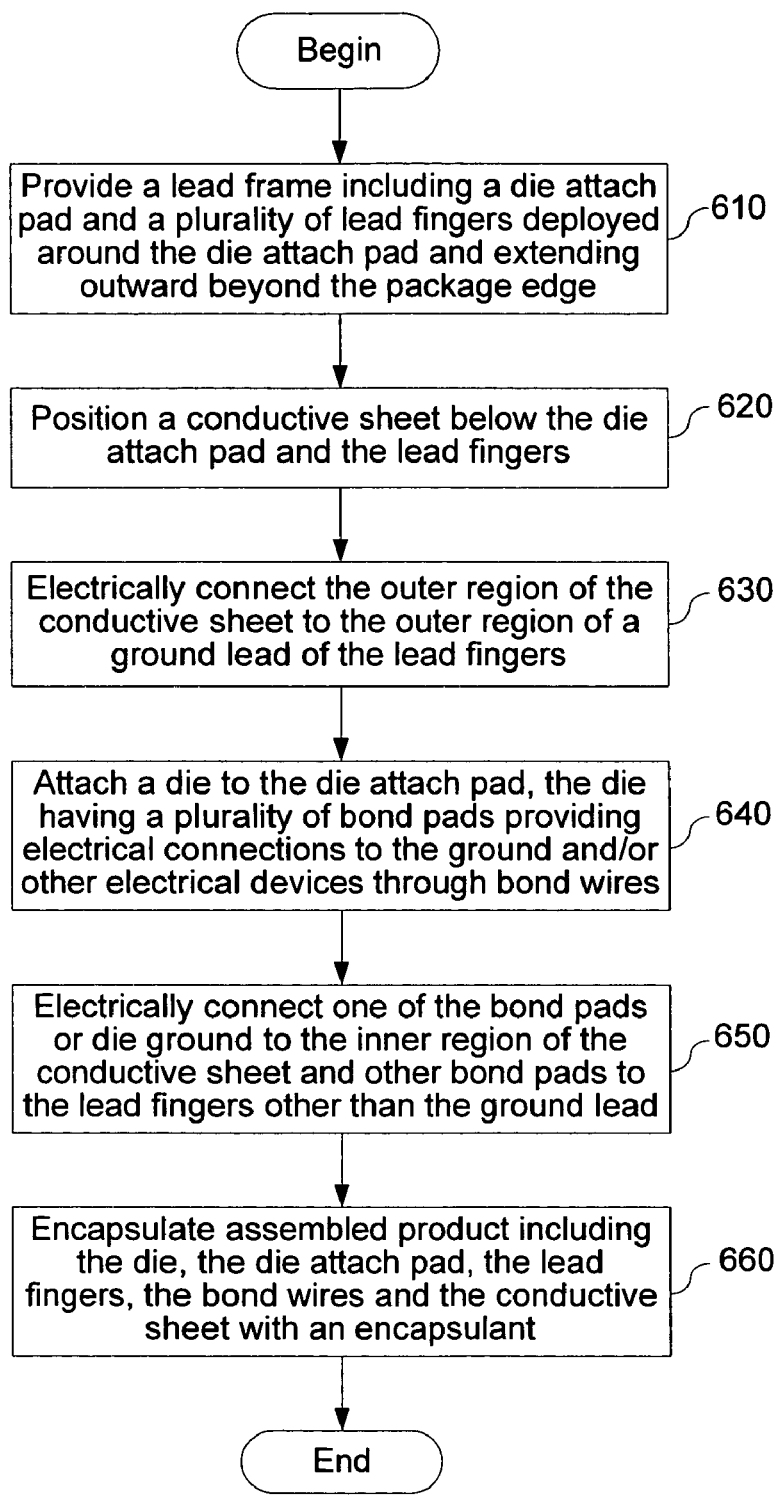
FIG. 6 is a flowchart illustrating the major steps of making an electrical device package according to the present invention.

Finally, FIG. 6 is a flowchart illustrating the major steps of building an electrical device package according to the present invention. First, a lead frame including a die attach pad and a plurality of lead fingers that are deployed around the die attach pad and extend outward beyond the package edge is provided (step 610). A conductive sheet is then positioned below the die attach pad and the lead fingers (step 620). In one embodiment, the conductive sheet has an inner region and an outer region. The outer region of the conductive sheet is electrically connected to the outer region of a lead finger selected as the ground lead (step 630). Following that, a die is then attached to the die attach pad (step 640). The die has a plurality of bond pads on its surface that provide necessary electrical connections to other devices and/or the ground through bond wires. One of the bond pads or the die ground is electrically connected to the inner region of the conductive sheet through a bond wire and other bond pads are connected to the lead fingers other than the ground lead (step 650). The encapsulant is then introduced to encapsulate the assembled product including the die, the die attach pad, the lead fingers, the bond wires and the conductive sheet (step 660). The encapsulant also insulates the conductive sheet from the lead fingers other than the ground lead. Preferably, the conductive sheet has one or more openings allowing the encapsulant from the two sides of the package to flow smoothly through the openings and combine together.

The foregoing description, for purpose of explanation, has been made with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An electrical device package comprising:
a die;
a plurality of lead fingers, some of the lead fingers being electrically connected to the die;
a conductive sheet having an inner region, an outer region and at least one opening in the sheet, the inner region being electrically connected to the die, and the outer region being electrically connected to at least one of the lead fingers and electrically insulated from other lead fingers electrically connected to the die, the conductive sheet providing at least one return current path from the die through the inner and outer regions of the conductive sheet to the lead finger(s) electrically connected to the conductive sheet; and
an encapsulant containing the die and the conductive sheet, a portion of the encapsulant on one side of the conductive sheet being physically connected to another portion of the encapsulant on the other side of the conductive sheet through the at least one opening in the conductive sheet.

2. The electrical device package of claim 1, wherein the lead fingers are substantially parallel to one another and the distance between two immediately adjacent lead fingers is about 80-100 microns.

3. The electrical device package of claim 1, wherein the inner region of the conductive sheet is electrically connected to a die attach pad and the die attach pad is electrically connected to a first surface of the die.

4. The electrical device package of claim 3, wherein the first surface of the die has a plurality of bond pads and the die attach pad is electrically connected to one of the bond pads through a bondwire.

5. The electrical device package of claim 1, wherein the at least one of the plurality of lead fingers is electrically connected to a ground.

6. The electrical device package of claim 1, wherein the at least one of the plurality of lead fingers is electrically connected to a power supply.

7. The electrical device package of claim 1, wherein the at least one opening has an area greater than or equal to 50% of a solid area of the conductive sheet.

8. The electrical device package of claim 1, wherein the at least one opening comprises a plurality of through holes in the conductive sheet.

9. The electrical device package of claim 8, wherein the through holes are regularly spaced on the conductive sheet and each hole is large enough for the encapsulant to move through the hole.

10. The electrical device package of claim 9, wherein each through hole has a diameter of at least 4 mils.

11. The electrical device package of claim 1, wherein the conductive sheet is made of copper.

12. The electrical device package of claim 1, wherein the conductive sheet is a mesh made of copper.

13. An electrical device package comprising:
a die attach pad; a die having a first surface and a second surface and a plurality of bond pads on the first surface, the second surface being adhered to the die attach pad and at least one of the plurality of bond pads being electrically connected to the die attach pad;
a plurality of lead fingers, a subset of the plurality of lead fingers being electrically connected to a subset of the bond pads on the first surface of the die through bondwires;
a conductive sheet having an inner region, an outer region and an array of through holes, the inner region being electrically connected to the die attach pad, and the outer region being electrically connected to at least one of the plurality of lead fingers and electrically insulated from other lead fingers that are electrically connected to the subset of bond pads, the conductive sheet providing at least one return current path from the die through the inner and outer regions of the conductive sheet to the lead finger(s) electrically connected to the conductive sheet; and
an encapsulant that encapsulates the die, the die attach pad and the conductive sheet, a first part of the encapsulant being physically connected to a second part of the encapsulant through the plurality of through holes in the conductive sheet.

* * * * *